United States Patent [19]
Yanagawa

[11] Patent Number: 5,994,888
[45] Date of Patent: Nov. 30, 1999

[54] SEMICONDUCTOR DEVICE REDUCING VOLTAGE CONSUMPTION IN VOLTAGE-DETECTION CIRCUIT

[75] Inventor: Miki Yanagawa, Kawasaki, Japan

[73] Assignee: Fujitsu Limited, Kanagawa, Japan

[21] Appl. No.: 09/010,542

[22] Filed: Jan. 22, 1998

[30] Foreign Application Priority Data

Jun. 10, 1997 [JP] Japan ................................ 9-152679
Jan. 7, 1998 [JP] Japan ................................ 10-001582

[51] Int. Cl.[6] ................ G05F 3/16; G05F 1/10; H03K 5/153; H03L 7/00
[52] U.S. Cl. .............. 323/313; 327/78; 327/89; 327/143; 327/544
[58] Field of Search ................ 323/313; 327/77, 327/78, 89, 143, 544

[56] References Cited

U.S. PATENT DOCUMENTS

| | | | |
|---|---|---|---|
| 3,584,240 | 6/1971 | Hoffman | 327/114 |
| 5,028,824 | 7/1991 | Young | 327/262 |
| 5,627,492 | 5/1997 | Weaver et al. | 327/544 |
| 5,696,465 | 12/1997 | Ishizuka | 327/544 |
| 5,731,720 | 3/1998 | Suzuki et al. | 327/77 |

FOREIGN PATENT DOCUMENTS

5-53667  3/1993  Japan ................... G05F 1/56

Primary Examiner—Peter S. Wong
Assistant Examiner—Bao Q. Vu
Attorney, Agent, or Firm—Nikaido Marmelstein Murray & Oram LLP

[57] ABSTRACT

A semiconductor device consuming a first voltage includes a voltage-detection circuit which detects a voltage level of the first voltage, and a control circuit which controls the voltage-detection circuit to operate for a predetermined time period in accordance with a timing at which the first voltage is started to be consumed.

19 Claims, 13 Drawing Sheets

FIG. 1

FIG. 2A DETECTION-START SIGNAL
FIG. 2B V
FIG. 2C VDIV / VREF
FIG. 2D P
FIG. 2E OUT

SEMICONDUCTOR DEVICE REDUCING VOLTAGE CONSUMPTION IN VOLTAGE-DETECTION CIRCUIT

BACKGROUND OF THE INVENTION

1. Field of the Invention

The present invention generally relates to semiconductor devices, and particularly relates to a semiconductor device which is provided with a voltage-level-detection circuit for detecting a voltage level of an internal voltage.

2. Description of the Related Art

Semiconductor devices are generally equipped with a mechanism to detect a level of a voltage used inside the devices. For example, when a voltage is internally generated in a semiconductor device for internal use, this internally generated voltage, which is different from a power voltage VDD and a ground voltage VSS externally provided, needs to be checked as to whether this voltage is kept at a predetermined voltage level. Based on the check results, the voltage level of the internally generated voltage is controlled.

In semiconductor memory devices such as DRAMs, when a voltage level VDD is to be stored in a capacitor serving as a memory cell, a cell transistor connected to this memory cell is turned on so as to supply electric charge from a bit line to the memory cell. In this case, the cell transistor needs to receive as a gate input thereof a voltage which is higher than the target voltage level VDD by a margin of a threshold voltage of the transistor. Moreover, this gate voltage needs to be further higher by a margin of an overdriving voltage in order to achieve high-speed charging up of the memory cell. When such a voltage level, higher than the externally provided power voltage, is required, a voltage pumping circuit is used. The semiconductor memory device may malfunction, however, when the pumped voltage declines as current consumption inside the device increases out of proportion to the supply of the pumped voltage. In order to avoid this, the pumped voltage level needs to be detected to attend to voltage-level control based on the detected voltage level.

Similar voltage-level detection and voltage-level control should also be conducted with regard to a substrate voltage, which is set to a voltage lower than the ground voltage in semiconductor devices.

The voltage-level-detection circuit used for above-described voltage-level detection detects a voltage level by dividing a target voltage using a series of resistors and by comparing the divided voltage with a reference voltage. Such a voltage-level-detection circuit is in operation at all the time, so that the series of resistors keeps consuming electric power.

This electric-power consumption is small. In view of recent development in the reduction of power consumption in semiconductor devices, however, even a small power consumption cannot be ignored.

Accordingly, there is a need for reducing power consumption in a voltage-level-detection circuit of a semiconductor device.

SUMMARY OF THE INVENTION

Accordingly, it is a general object of the present invention to provide a voltage-level-detection circuit and a semiconductor device which can satisfy the need described above.

It is another and more specific object of the present invention to provide a voltage-level-detection circuit and a semiconductor device which can reduce power consumption in the voltage-level-detection circuit.

In order to achieve the above objects according to the present invention, a semiconductor device consuming a first voltage includes a voltage-detection circuit which detects a voltage level of the first voltage, and a control circuit which controls the voltage-detection circuit to operate for a predetermined time period in accordance with a timing at which the first voltage is started to be consumed.

In the semiconductor device described above, the voltage-detection circuit is operated for the predetermined time period in accordance with the timing at which the first voltage is started to be consumed, so that an unnecessary voltage-detection operation is avoided before the start of voltage consumption or after the end of the voltage detection, thereby reducing power consumption in the voltage-detection circuit.

According to another aspect of the present invention, the voltage-detection circuit is operated for the predetermined time period starting from the start of the voltage consumption, so that an unnecessary voltage-detection operation is avoided before the start of voltage consumption or after the end of the voltage detection, thereby reducing power consumption in the voltage-detection circuit.

According to yet another aspect of the present invention, the control circuit learns the timing of the start of the voltage consumption by receiving a detection-start signal indicating the start of the voltage consumption from the trigger circuit which triggers a start of an operation of a load circuit.

According to yet another aspect of the present invention, the first voltage is adjusted according to a detection result obtained by the voltage-detection circuit, so that the first voltage can be brought back to a desired voltage level when the first voltage is deviated from said desired voltage level because of the voltage consumption.

According to yet another aspect of the present invention, the voltage detection can be performed by using a potential-divider circuit and a comparator circuit.

According to yet another aspect of the present invention, when the voltage level detected by the voltage-detection circuit turns out to be different from a desired voltage level, the operation of the voltage-detection circuit is stopped based on a notion that the role of the voltage-detection circuit is completed. Since an unnecessary voltage-detection operation is avoided after it is found that the detected voltage is different from the desired voltage level, power consumption in the voltage-detection circuit can be reduced.

According to yet another aspect of the present invention, when an actual power consumption is delayed behind a timing of the detection-start signal, the voltage-detection operation is not conducted until the power consumption actually starts or is about to start, thereby further reducing power consumption in the voltage-detection circuit.

Further, according to the present invention, a semiconductor memory device consuming a pumped voltage when performing row-access operations and precharge operations includes a voltage-detection circuit which detects a voltage level of the pumped voltage, and a control circuit which controls the voltage-detection circuit to operate for a predetermined time period in accordance with a timing at which either one of the row-access operations and the precharge operations is started.

In the semiconductor memory device described above, the voltage-detection circuit is operated only for the predetermined time period in accordance with a timing at which either one of the row-access operations and the precharge operations is started. Because of this, an unnecessary voltage-detection operation is avoided before the start of consumption of the pumped voltage or after the end of the voltage detection, thereby reducing power consumption in the voltage-detection circuit.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
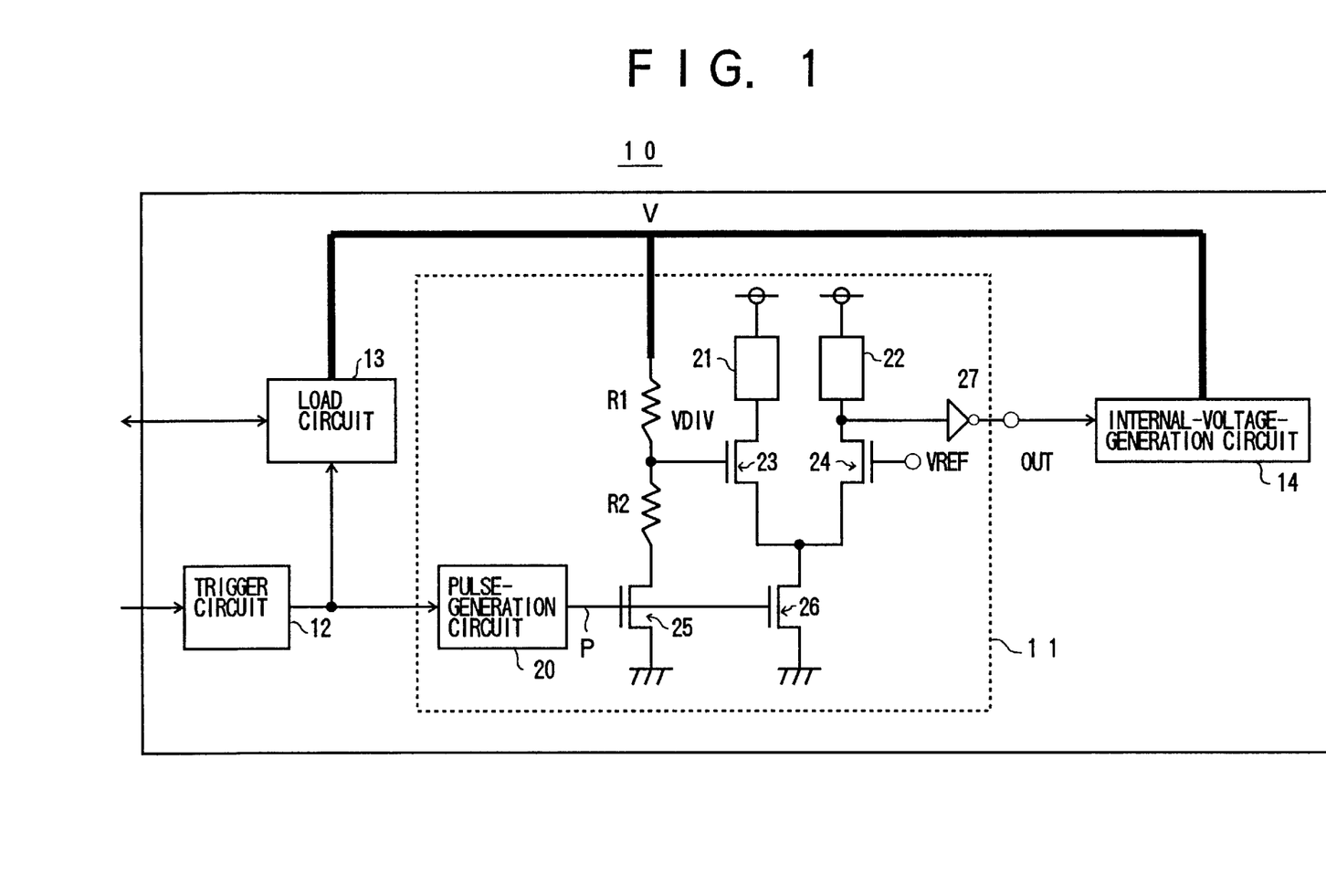
FIG. 1 is a circuit diagram of a semiconductor device in which a voltage-level-detection circuit according to a first embodiment of the present invention is employed.

FIG. 1 is a circuit diagram of a semiconductor device in which a voltage-level-detection circuit according to a first embodiment of the present invention is employed.

A semiconductor device 10 of FIG. 1 includes a voltage-detection circuit 11, a trigger circuit 12, a load circuit 13, and an internal-voltage-generation circuit 14. The voltage-detection circuit 11 is an element according to the present invention, and the trigger circuit 12, the load circuit 13, and the internal-voltage-generation circuit 14 are generally used in conventional semiconductor devices.

The internal-voltage-generation circuit 14 generates an internal voltage used inside the semiconductor device 10. In the case of a semiconductor memory device such as a DRAM, the internal-voltage-generation circuit 14 may be a pumping circuit for generating a pumped voltage and/or a substrate-voltage-generation circuit for generating a substrate voltage. A voltage V generated by the internal-voltage-generation circuit 14 is supplied to the load circuit 13, where the voltage V is consumed. The load circuit 13 is a circuit for processing data, storing data, controlling operations, etc., in the semiconductor device 10. In the case of a semiconductor memory device such as a DRAM, the load circuit 13 includes a memory-core circuit, decoder circuits, and/or control circuits.

The trigger circuit 12 gives an instruction to the load circuit 13 to start operation in accordance with an input signal externally provided. Assume that the semiconductor device 10 of FIG. 1 is a semiconductor memory device such as a DRAM, and that the load circuit 13 includes a memory-core circuit and a row-access control circuit such as a row decoder. In this case, the trigger circuit 12 corresponds to a command decoder and a RAS-signal-generation circuit which receive a RAS command and generate a RAS signal. When the RAS signal is supplied to the load circuit 13, the load circuit 13 performs a row-address-access operation.

The voltage-detection circuit 11 receives the voltage V which is consumed in the load circuit 13, and compares a voltage obtained by dividing the voltage V with a reference voltage VREF so as to detect the voltage level of the voltage V. A voltage-level-detection circuit of the related art keeps detecting the voltage level of the voltage V. On the other hand, the voltage-detection circuit 11 of the present invention receives a signal when the trigger circuit 12 sends this signal to trigger the load circuit 13. With this signal as a trigger, the voltage-detection circuit 11 starts the voltage-level-detection operation. The voltage-detection circuit 11 stops detecting the voltage level when a predetermined time period passes since the start of the voltage-level-detection operation.

In this manner, the voltage-detection circuit 11 starts detecting the voltage level at the same timing as the load circuit 13 starts an operation thereof, so that the voltage-detection circuit 11 can reliably detect a decline in the voltage V when the load circuit 13 consumes electric power. Further, the voltage-detection circuit 11 performs the voltage-level-detection operation for only a predetermined time period. The duration of this predetermined time period may be set to a period substantially equal to an operation period of the load circuit 13 if the operation period of the load circuit 13 is substantially constant and known in advance. Even if the operation period of the load circuit 13 is unknown, the voltage-level-detection operation can be stopped after the passage of the predetermined time period without causing any trouble, as long as the power consumption in the load circuit 13 is not volatile. This is because a voltage decline is not likely to happen if the voltage V does not decrease during the predetermined time period.

In this manner, the voltage-detection circuit 11 of the present invention reliably detects a voltage decline caused by the load circuit 13. The voltage-detection circuit 11 does not perform a voltage-detection operation before the load circuit 13 starts an operation, because no voltage decline should happen before the start of the operation. The voltage-detection circuit 11 also stops a voltage-detection operation after the passage of a predetermined time period from the start of the voltage-detection operation. Because of these operation timings, power consumption in the voltage-detection circuit 11 can be reduced to a minimum level.

In FIG. 1, the voltage-detection circuit 11 includes a pulse-generation circuit (i.e.; control circuit) 20, loads 21 and 22, NMOS transistors 23 through 26, an inverter 27, and resistors R1 and R2. The loads 21 and 22 and the NMOS transistors 23 through 26 together make up a differential amplifier. The resistors R1 and R2 together form a potential divider for dividing a voltage level V. The differential amplifier and the potential divider together form a core portion of the voltage-detection circuit as this core portion actually detects the voltage level V. The NMOS transistors 25 and 26 serve as a switch for controlling the potential divider and the differential amplifier as to whether they operate or not. The NMOS transistors 25 and 26 receives at a gate input thereof an output of the pulse-generation circuit 20.

The pulse-generation circuit 20 receives a signal from the trigger circuit 12, and generates a pulse signal P keeping a HIGH level for a predetermined period when receiving the signal from the trigger circuit 12. The pulse signal P turns the NMOS transistors 25 and 26 on, so that the potential divider and the differential amplifier operate for the above-mentioned predetermined period. The differential amplifier compares the reference voltage VREF with a divided voltage VDIV which is created by the potential divider. When the divided voltage VDIV is lower, a LOW-level signal is supplied to an input of the inverter 27. In this case, the voltage-detection circuit 11 outputs a signal OUT having a HIGH level.

The voltage-detection circuit 11 supplies the signal OUT having the HIGH level to the internal-voltage-generation circuit 14 so as to make the internal-voltage-generation circuit 14 adjust the output voltage V. Operations of the internal-voltage-generation circuit 14, which may be one of a pumping circuit and a substrate-voltage-generation circuit, are well within the scope of ordinary skill in the art, and a description thereof will be omitted here.

FIGS. 2A through 2E are timing charts for explaining voltage-detection operations of the semiconductor device 10 shown in FIG. 1.

Figure 2A:
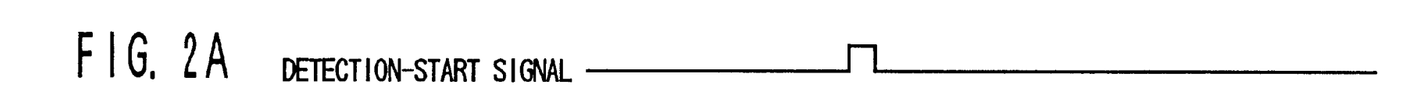
FIGS. 2A through 2E are timing charts for explaining voltage-detection operations of the semiconductor device shown in FIG. 1.
Figure 2B:
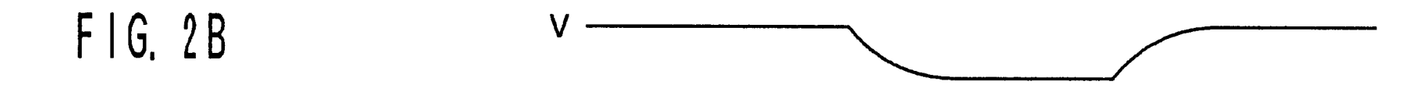
Figure 2C:
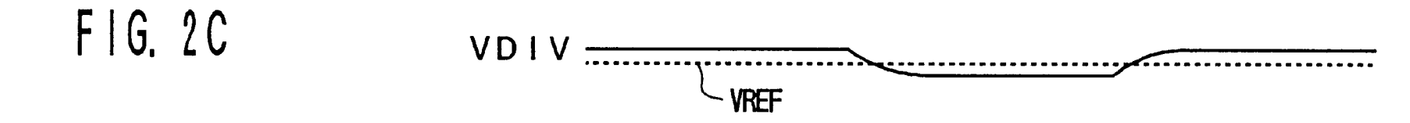
Figure 2D:
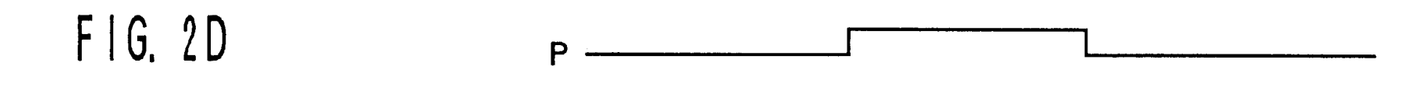
Figure 2E:
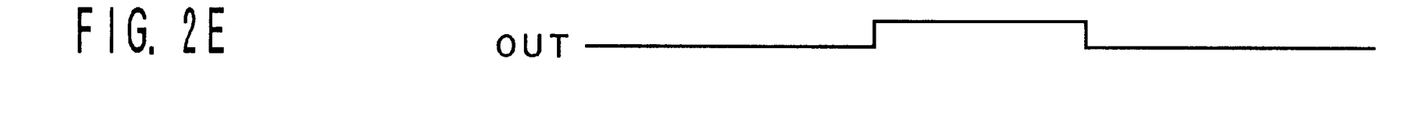

As shown in the figures, when a detection-start signal that is input to the pulse-generation circuit 20 becomes HIGH, the pulse signal P output from the pulse-generation circuit 20 is triggered and keeps a HIGH level for a predetermined period. Since the detection-start signal is also a trigger signal supplied from the trigger circuit 12 to the load circuit 13, a HIGH level of the detection-start signal also signals the start of an operation of the load circuit 13. This operation of the load circuit 13 brings about a decline in the voltage V. In the same manner as the voltage V, the divided voltage VDIV obtained by dividing the voltage V also declines. In FIG. 2C, the reference voltage VREF is shown along with the divided voltage VDIV. If the divided voltage VDIV goes down below the reference voltage VREF during the HIGH period of the pulse signal P, the signal OUT of the voltage-detection circuit 11 becomes HIGH. As the signal OUT becomes HIGH, the internal-voltage-generation circuit 14 start adjusting the output voltage V. Because of this adjustment, the voltage V and the divided voltage VDIV are brought back to their respective original levels.

Figure 3:
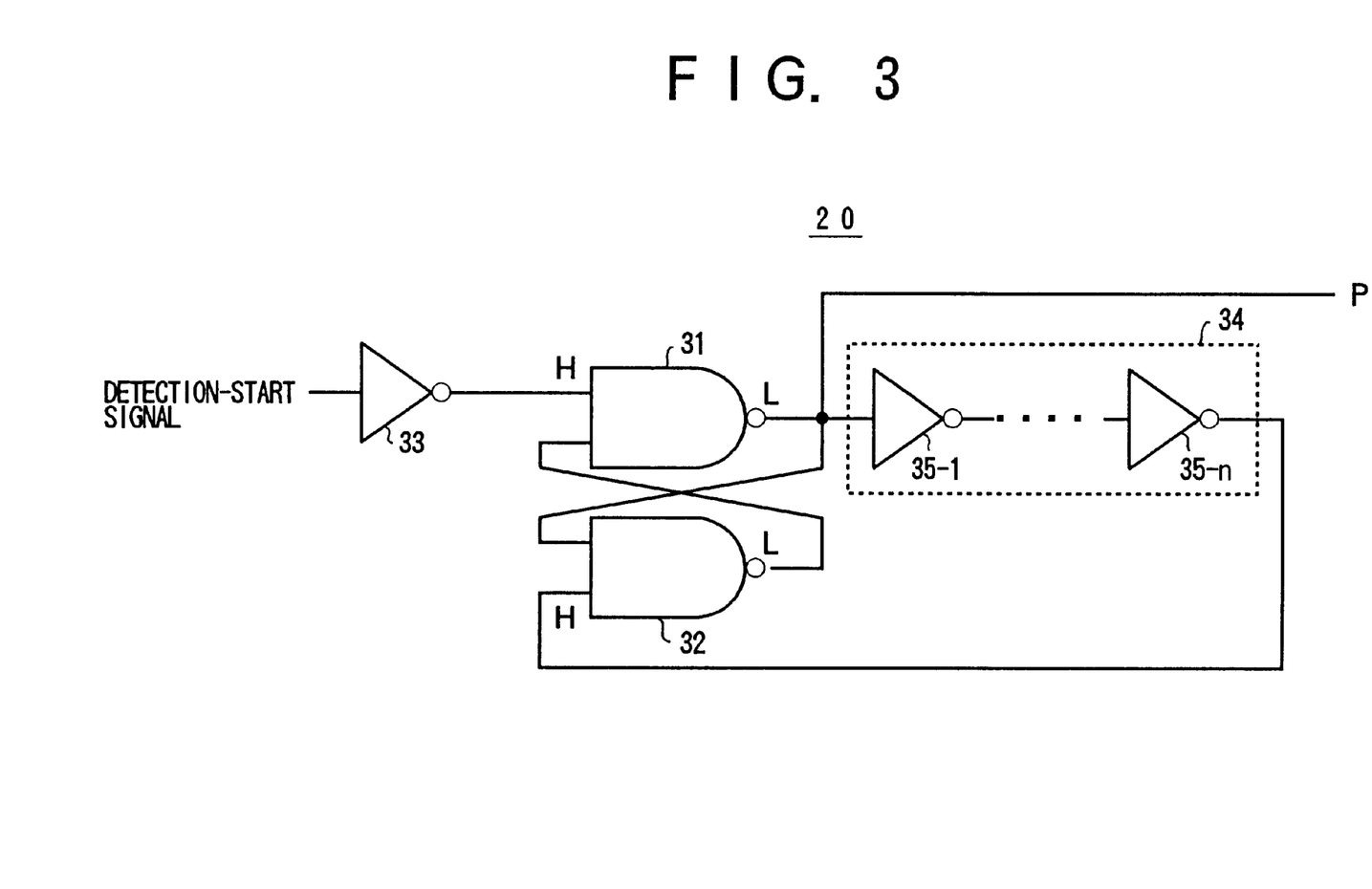
FIG. 3 is a circuit diagram of a pulse-generation circuit.

FIG. 3 is a circuit diagram of the pulse-generation circuit 20.

The pulse-generation circuit 20 of FIG. 3 includes NAND circuits 31 and 32, an inverter 33, and a reversed-phase delay circuit 34. The reversed-phase delay circuit 34 includes a plurality of inverters 35-1 through 35–n (n: odd number). The NAND circuits 31 and 32 together form a latch. This latch has two inputs thereof, which are HIGH in an initial state. In this initial state, the latch holds a status in which an output of the NAND circuit 31 is LOW. The pulse signal P output form the pulse-generation circuit 20, therefore, is LOW in the initial state.

As the detection-start signal becomes HIGH, the output of the inverter 33 is changed to LOW, which inverts the condition of the latch, changing the output of the NAND circuit 31 to HIGH. This marks a change to HIGH in the output signal P from the pulse-generation circuit 20. The change to HIGH in the output of the NAND circuit 31 propagates through the reversed-phase delay circuit 34 while incurring some delays, and is input to the NAND circuit 32 forming the latch as a change to LOW. This happens after a predetermined time period. By the time when this happens, the detection-start signal has changed back to the LOW level. Thus, a change to LOW in the input from the reversed-phase delay circuit 34 to the NAND circuit 32 brings back the status of the latch to the initial state. Namely, the output signal P of the pulse-generation circuit 20 returns to LOW.

In this manner, the pulse-generation circuit 20 generates the pulse signal P, and the HIGH period of the pulse signal P is determined by the amount of delay of the reversed-phase delay circuit 34. Adjustment of the number of delay elements (inverters 35-1 through 35–n), which constitute the reversed-phase delay circuit 34, makes it possible to generate the pulse signal P having a desired pulse width.

Figure 4:
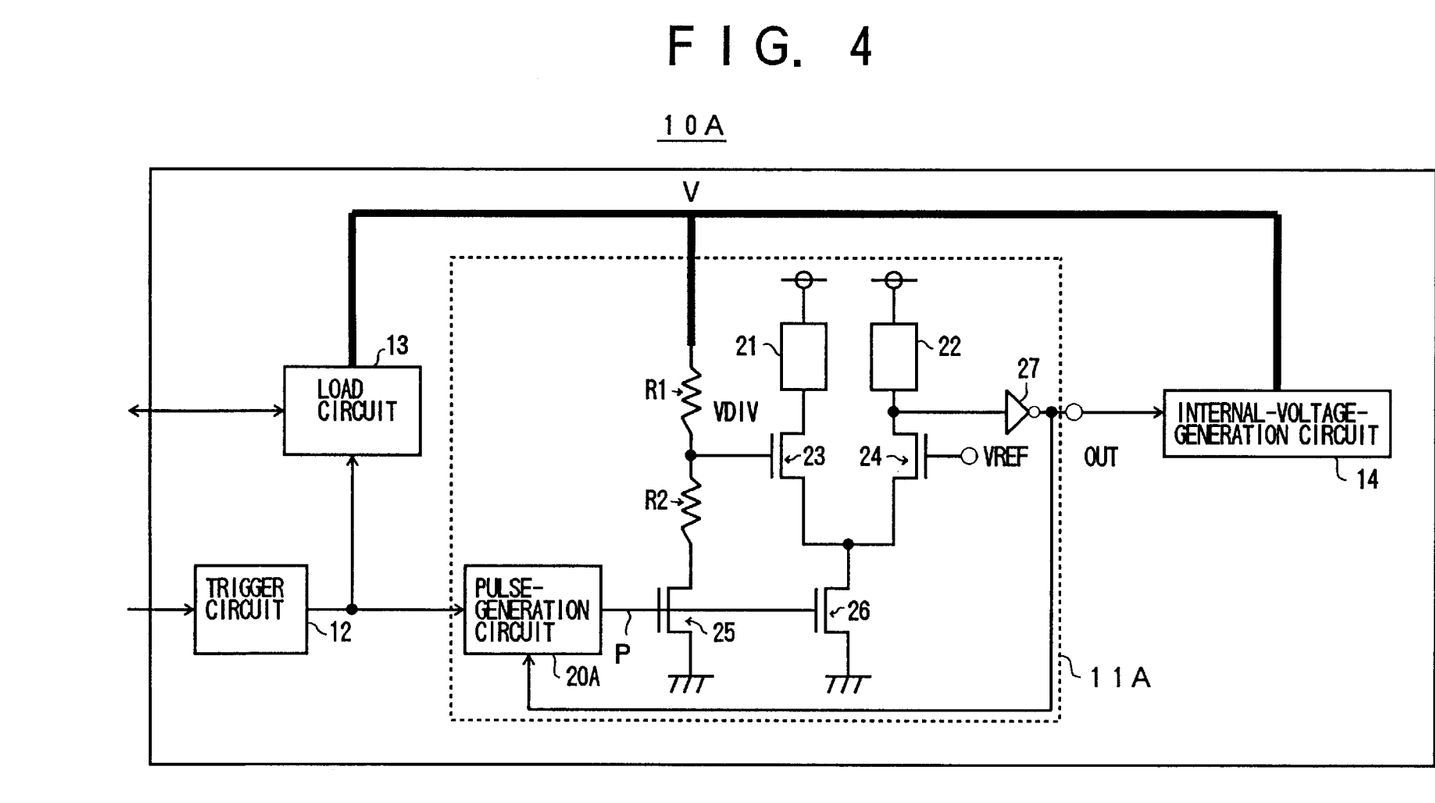
FIG. 4 is a circuit diagram of a semiconductor device in which a voltage-level-detection circuit according to a second embodiment of the present invention is employed.

FIG. 4 is a circuit diagram of a semiconductor device in which a voltage-level-detection circuit according to a second embodiment of the present invention is employed. In FIG. 4, the same elements as those of FIG. 1 are referred to by the same numerals, and a description thereof will be omitted.

A semiconductor device 10A of FIG. 4 includes a voltage-detection circuit 11A, the trigger circuit 12, the NMOS transistors 23 through 26, and the internal-voltage-generation circuit 14. Only the voltage-detection circuit 11A among those circuit elements is different from that of FIG. 1. In the voltage-detection circuit 11A, the signal OUT output from the voltage-detection circuit 11A (output from the inverter 27) is fed back to the pulse-generation circuit 20A.

Upon receiving the detection-start signal from the trigger circuit 12, the pulse-generation circuit 20A generates the pulse signal P maintaining a HIGH level for a predetermined time period. The pulse-generation circuit 20A, however, resets the pulse signal P to LOW even during this predetermined time period if the fed-back signal OUT becomes HIGH. Namely, when the signal OUT prompts the internal-voltage-generation circuit 14 to adjust the voltage V upon detection of a voltage decline, the pulse signal P is reset to LOW. This reset operation stops the voltage-detection operation of the voltage-detection circuit 11A.

FIGS. 5A through 5E are timing charts for explaining voltage-detection operations of the semiconductor device 10A shown in FIG. 4.

Figure 5A:
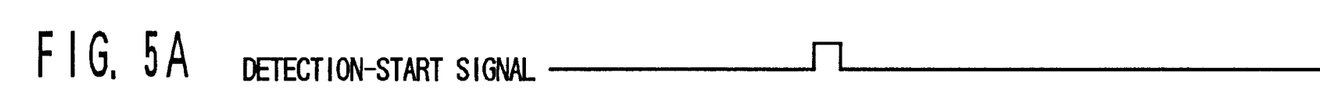
FIGS. 5A through 5E are timing charts for explaining voltage-detection operations of the semiconductor device shown in FIG. 4.
Figure 5B:
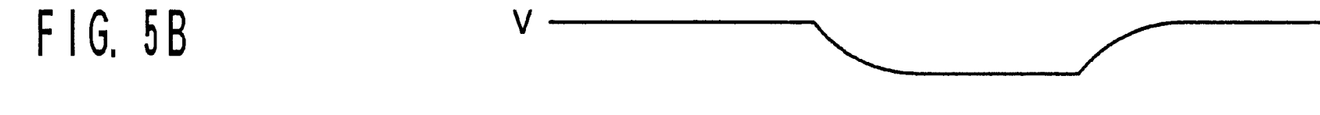
Figure 5C:
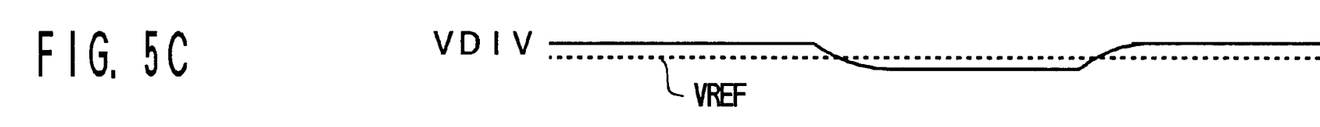
Figure 5D:
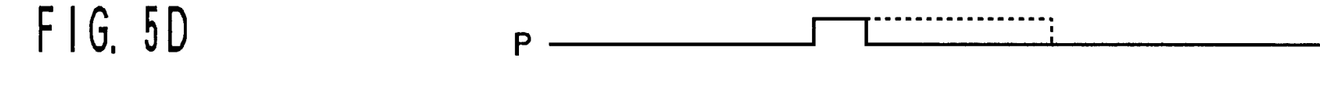
Figure 5E:
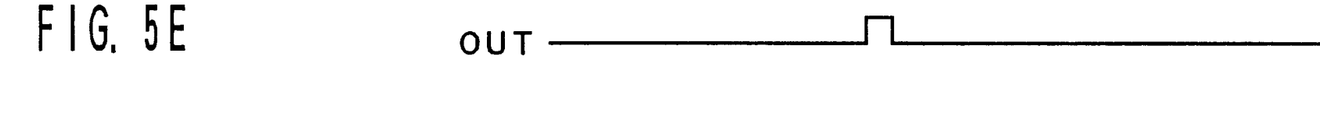

As shown in the figures, when the detection-start signal becomes HIGH, the pulse signal P is changed to HIGH. As long as no reset operation is performed, the pulse signal P maintains the HIGH level thereof for a predetermined time period as shown by dotted lines. In an example of FIG. 5D, the voltage V and the divided voltage VDIV go down during the HIGH period of the pulse signal P, so that the signal OUT is changed to HIGH, thereby resetting the pulse signal P. That is, the pulse signal P returns to LOW ahead of schedule before the end of the predetermined time period. Because the signal OUT is changed to HIGH, the internal-voltage-generation circuit 14 adjusts the output voltage V. As a result, the voltage V and the divided voltage VDIV return to their respective original levels as shown in FIG. 5C.

In this manner, the second embodiment of the present invention shown in FIG. 4 and FIG. 5 stops the voltage-detection operation of the voltage-detection circuit 11A ahead of schedule before the end of the predetermined time period if a voltage decline is detected. The detection of the voltage decline means that the voltage-detection circuit 11A has completed its expected role. By canceling the remaining excessive part of the voltage-detection operation, power consumption can be further reduced. Unless a voltage decline is detected, the voltage is kept under surveillance for the scheduled predetermined time period.

Figure 6:
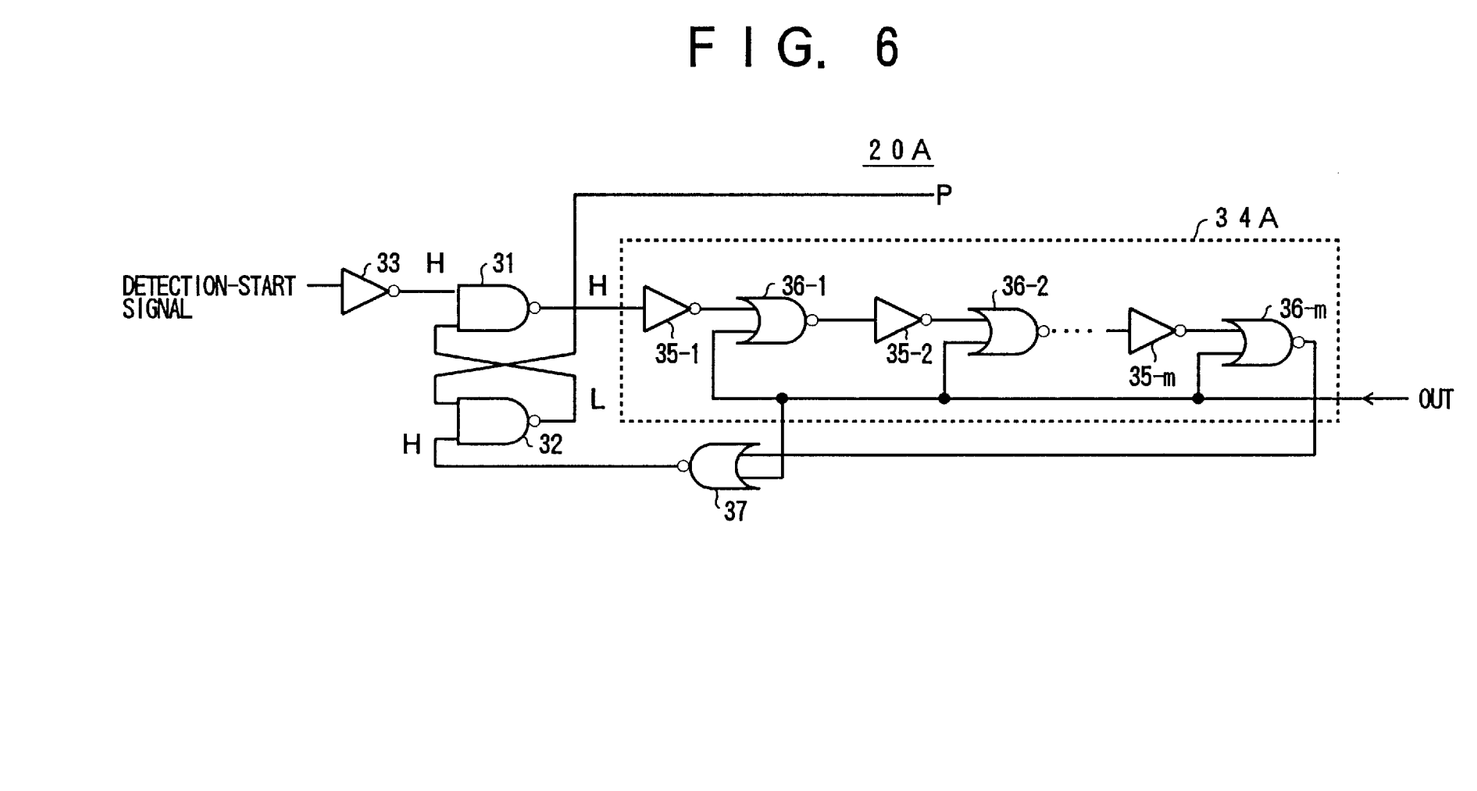
FIG. 6 is a circuit diagram of a pulse-generation circuit.

FIG. 6 is a circuit diagram of the pulse-generation circuit 20A. In FIG. 6, the same elements as those of FIG. 3 are referred to by the same numerals, and a description thereof will be omitted.

The pulse-generation circuit 20A of FIG. 6 differs from the pulse-generation circuit 20 of FIG. 3 in that a delay circuit 34A and a NOR circuit 37 are provided. Here, the delay circuit 34A can be reset. The delay circuit 34A includes inverters 35-1 through 35–m (m: even number) and NOR circuits 36-1 through 36–m. One input of the NOR circuits 36-1 through 36–m receives the signal OUT, which is fed back as previously described. When the signal OUT is LOW, the NOR circuits 36-1 through 36–m serve as an inverter for the other input thereof. The NOR circuit 37 also serves as an inverter for one input thereof when the signal OUT supplied to the other input thereof is LOW. When the signal OUT is LOW, therefore, the delay circuit 34A and the NOR circuit 37 allow a signal to propagate therethrough with some delays in the same manner as does the reversed-phase delay circuit 34, and outputs a signal of a reversed phase. That is, the pulse-generation circuit 20A of FIG. 6 performs the same function as the pulse-generation circuit 20 of FIG. 3 as long as the signal OUT is LOW.

HIGH/LOW levels of inputs and outputs are shown in FIG. 6 with regard to the latch formed by the NAND circuits 31 and 32. These HIGH/LOW levels indicate the status of the latch during the HIGH period of the pulse signal P, i.e., during a period when a change to HIGH in the output of the NAND circuit 31 is still propagating through the delay circuit 34A. If the signal OUT is changed to HIGH during this period, the output of the NOR circuit 37 becomes LOW, so that the status of the latch is reversed. As a result, the pulse signal P returns to LOW. Since all the outputs of the NOR circuits 36-1 through 36–m of the delay circuit 34A are changed to LOW, the change to HIGH in the output of the NAND circuit 31 is canceled while this change is propagating through the delay circuit 34A.

Accordingly, if the signal OUT is changed to HIGH during the HIGH period of the pulse signal P, the pulse signal P returns to LOW, and, at the same time, the internal conditions of the pulse-generation circuit 20A are also brought back to initial conditions.

Figure 7:
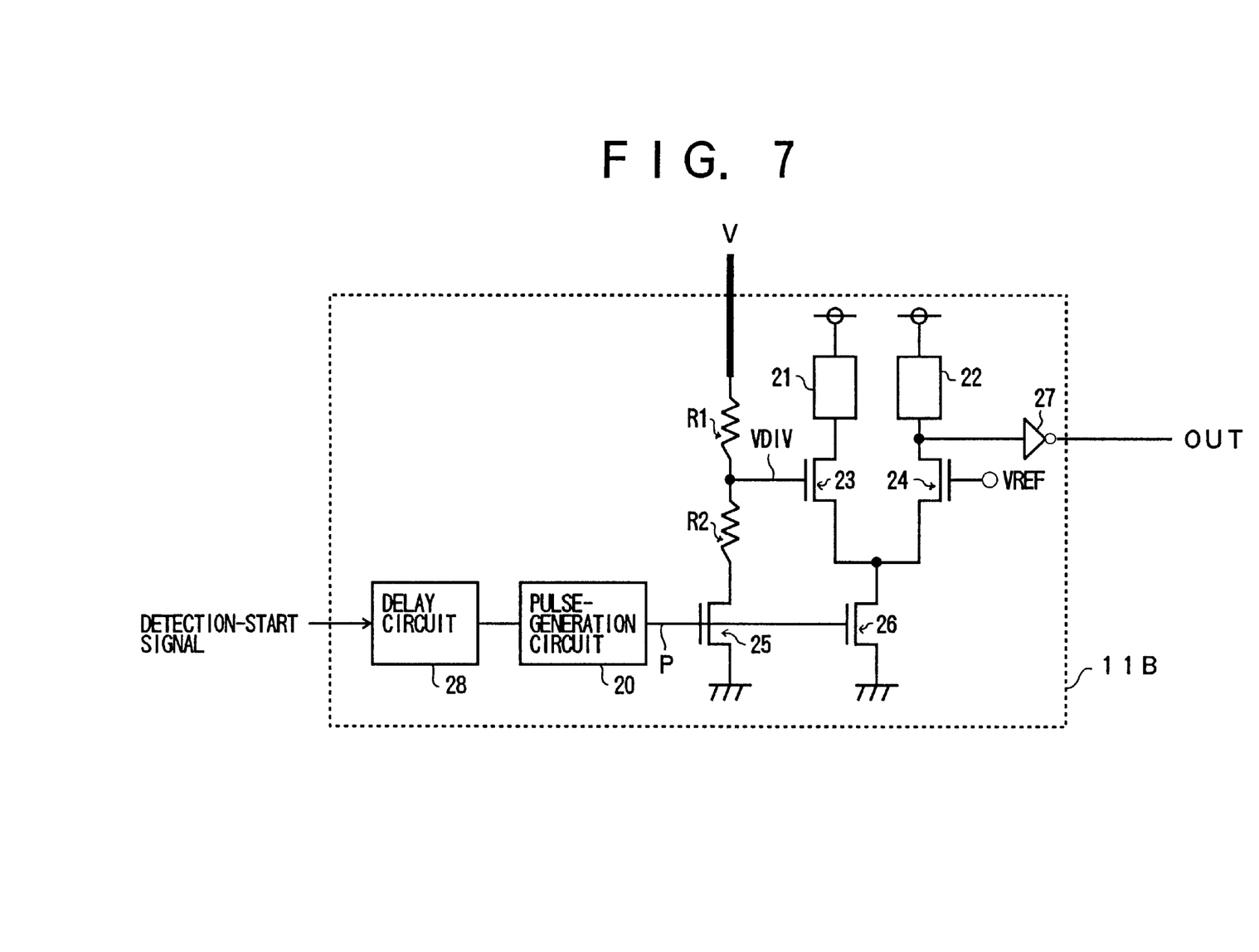
FIG. 7 is a circuit diagram of a voltage-detection circuit according to a third embodiment of the present invention.
Figure 8A:
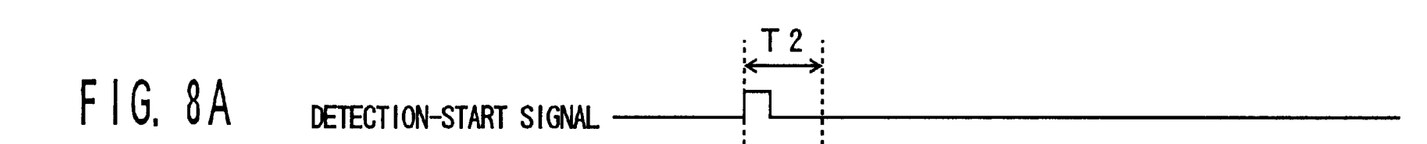
FIGS. 8A through 8E are timing charts for explaining operations of the voltage-detection circuit shown in FIG. 7.
Figure 8B:
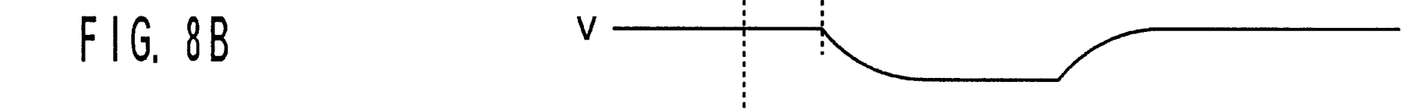
Figures 8C, 8D:
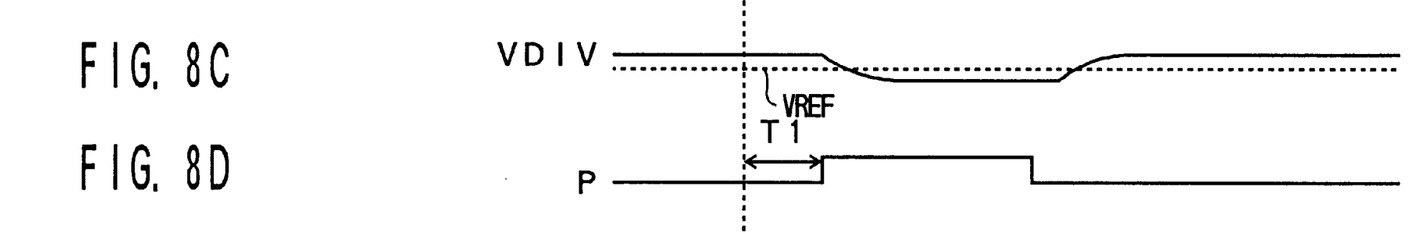
Figure 8E:
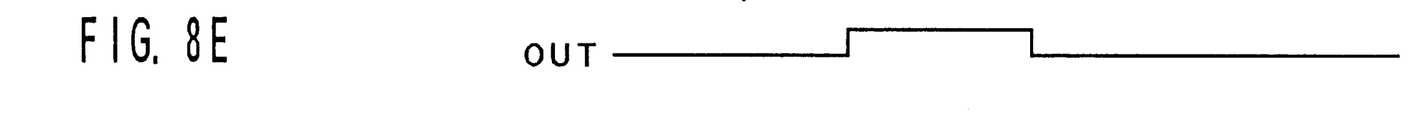

FIG. 7 is a circuit diagram of the voltage-detection circuit according to a third embodiment of the present invention. In FIG. 7, the same elements as those of FIG. 1 are referred to by the same numerals, and a description thereof will be omitted.

The load circuit 13 of FIG. 1, when starts operating upon receiving an operation-start instruction from the trigger circuit 12, may have a slight delay in starting consuming the voltage V from the moment of the start of the operation. Further, even if the load circuit 13 starts consuming the voltage V, there is no guarantee that the voltage V immediately starts falling.

In consideration of these, a voltage-detection circuit 11B of FIG. 7 has a delay circuit 28 additionally provided for the voltage-detection circuit 11A of FIG. 1. The delay circuit 28 delays the detection-start signal before supplying it to the pulse-generation circuit 20 so as to cope with a possible delay of a start of a voltage decline from the moment of detection-start-signal generation. In this manner, the voltage-detection circuit 11B postpones the start of the voltage-detection operation until the voltage V actually begins falling or is about to start falling.

FIGS. 8A through 8E are timing charts for explaining the operations of the voltage-detection circuit 11B shown in FIG. 7.

As shown in the figures, when the detection-start signal becomes HIGH, the pulse signal P is changed to HIGH after a delay T1 introduced by the delay circuit 28. The voltage V starts to decline when a time T2 passes from the moment of the change to HIGH in the detection-start signal. Along with the voltage V, the divided voltage VDIV obtained by dividing the voltage V starts falling after the passage of the time T2. The delay T1 of the delay circuit 28 is set so as to approximately match the delay time T2 of the voltage decline. When the divided voltage VDIV becomes lower than the reference voltage VREF during the HIGH period of the pulse signal P, the signal OUT output from the voltage-detection circuit 11B becomes HIGH. As the signal OUT becomes HIGH, the voltage V is adjusted. Because of this adjustment, the voltage V and the divided voltage VDIV are brought back to their respective original levels.

In this manner, the third embodiment of the present invention starts the voltage-detection operation at a timing which is delayed by a predetermined delay length behind the timing of the detection-start signal, so that the voltage detection can be started at the same timing as when the voltage decline actually takes place. Because the voltage-detection operation is not performed until an approximate time of an actual decline in the voltage, no excessive power is consumed. Further, the voltage-detection operation is stopped when a predetermined time period passes from the moment of the start of the operation, so that power consumption in the voltage-detection circuit 11B can be reduced to a minimum level.

Figure 9:
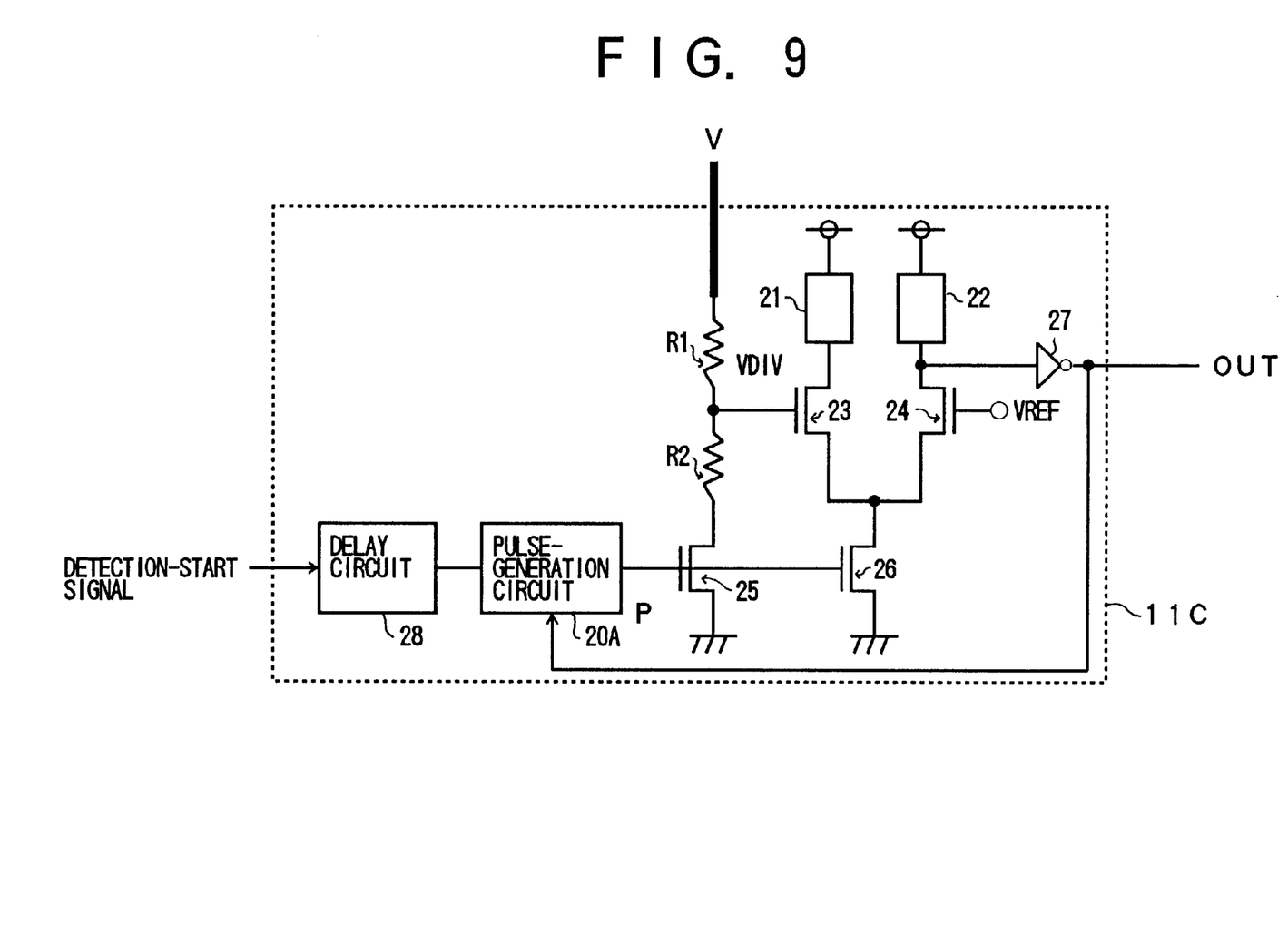
FIG. 9 is a circuit diagram of a voltage-detection circuit according to a fourth embodiment of the present invention.

FIG. 9 is a circuit diagram of the voltage-detection circuit according to a fourth embodiment of the present invention. In FIG. 9, the same elements as those of FIG. 4 and FIG. 7 are referred to by the same numerals, and a description thereof will be omitted.

In a voltage-detection circuit 11C of FIG. 9, the signal OUT output from the voltage-detection circuit 11C (output from the inverter 27) is fed back to the pulse-generation circuit 20A. Other configurations are the same as those of the voltage-detection circuit 11B of the third embodiment shown in FIG. 7.

In the same manner as in the second embodiment of FIG. 4, upon receiving the detection-start signal, the pulse-generation circuit 20A generates the pulse signal P which maintains a HIGH level for a predetermined time period. When the fed-back signal OUT becomes HIGH, however, the pulse signal P is reset to LOW even during the above-mentioned predetermined time period. Namely, when a decline in the voltage V is detected, the pulse signal P is reset to LOW based on a notion that an expected role of the voltage-detection circuit 11C is completed, thereby stopping the voltage-detection operation of the voltage-detection circuit 11C.

FIGS. 10A through 10E are timing charts for explaining the operations of the voltage-detection circuit 11C shown in FIG. 9.

Figure 10A:
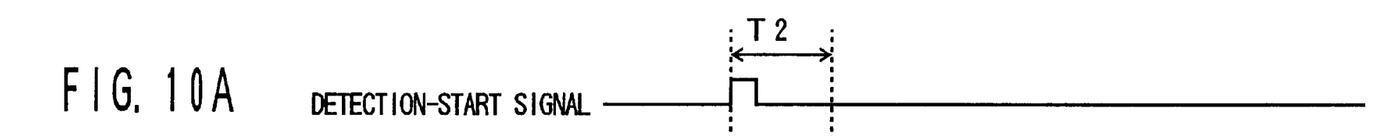
FIGS. 10A through 10E are timing charts for explaining operations of the voltage-detection circuit shown in FIG. 9.
Figure 10B:
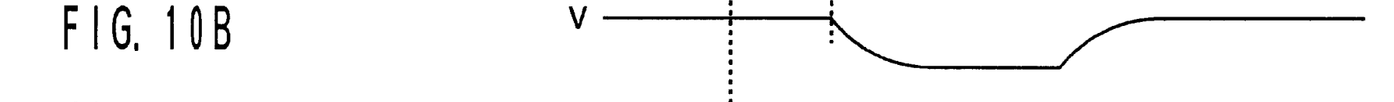
Figure 10C:
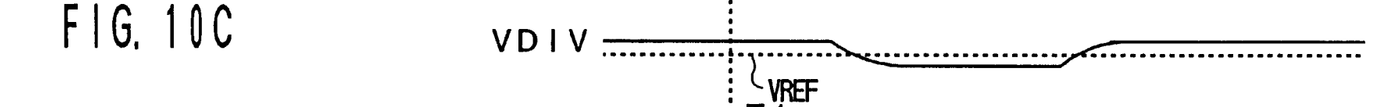
Figure 10D:
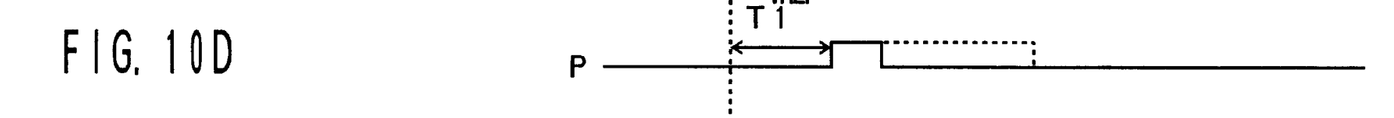
Figure 10E:
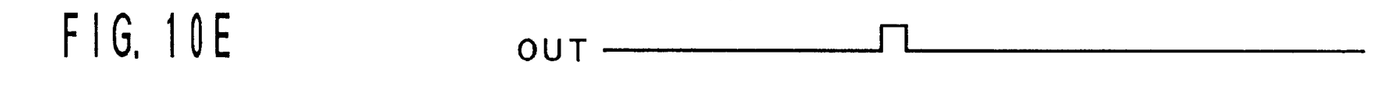

As shown in the figures, when the detection-start signal becomes HIGH, the pulse signal P is changed to HIGH after a delay T1 introduced by the delay circuit 28. The voltage V starts to decline when the time T2 passes from the moment of the change to HIGH in the detection-start signal. Along with the voltage V, the divided voltage VDIV obtained by dividing the voltage V starts falling after the passage of the time T2. The delay T1 of the delay circuit 28 is set so as to approximately match the delay time T2 of the voltage decline. As long as no reset operation is performed, the pulse signal P maintains the HIGH level thereof for a predetermined time period as shown by dotted lines. In an example of FIGS. 10B and 10C, the voltage V and the divided voltage VDIV go down during the HIGH period of the pulse signal P, so that the signal OUT is changed to HIGH, thereby resetting the pulse signal P. That is, the pulse signal P returns to LOW ahead of schedule before the end of the predetermined time period. Because the signal OUT is changed to HIGH, the voltage V is adjusted. As a result, the voltage V and the divided voltage VDIV return to their respective original levels as shown in FIGS. 10B and 10C.

In this manner, the fourth embodiment of the present invention starts the voltage-detection operation at a timing which is delayed by a predetermined delay length behind the timing of the detection-start signal, so that the voltage detection can be started approximately at the same timing as when the voltage decline actually takes place. Further, the fourth embodiment stops the voltage-detection operation of the voltage-detection circuit 11C ahead of schedule before the end of the predetermined time period if a voltage decline is detected. Namely, the fourth embodiment can avoid excessive power consumption because the voltage-detection operation is not started before an actual decline in the voltage as well as because an unnecessary voltage-detection operation is not conducted after the detection of a voltage decline. In this manner, power consumption in the voltage-detection circuit 11C can be reduced to a necessary minimum level.

In what follows, detailed circuit configurations will be described with regard to a case in which the semiconductor devices of the above embodiments are a DRAM device.

Figure 11:
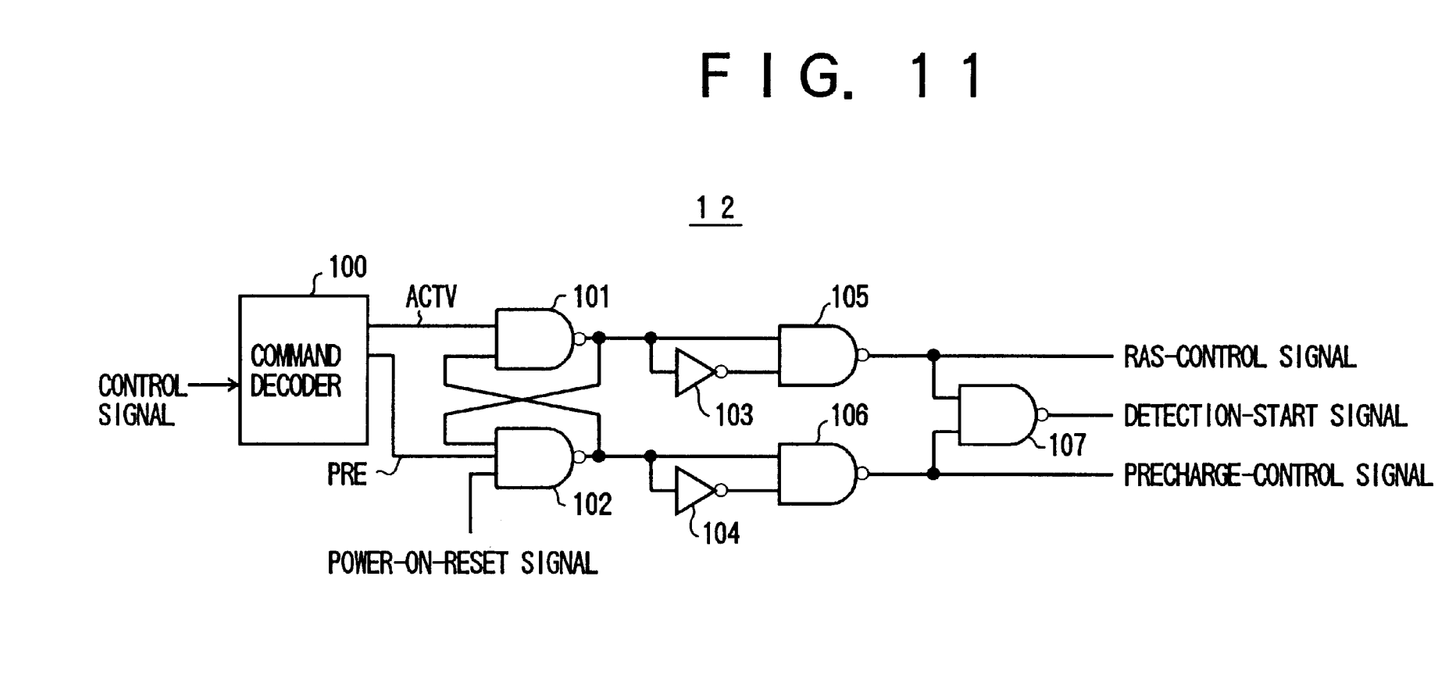
FIG. 11 is a circuit diagram of a trigger circuit.

FIG. 11 is a circuit diagram of the trigger circuit 12.

The trigger circuit 12 of FIG. 11 includes a command decoder 100, NAND circuits 101 and 102, inverters 103 and 104, and NAND circuits 105 through 107.

The command decoder 100 is the same as a normal command decoder which would be implemented in a conventional DRAM, and receives control signals such as /RAS, /CAS, /WE, /CS, etc., from an external source to decode these control signals. As decoding results, the command decoder 100 generates a signal ACTV for indicating a row-access operation and a signal PRE for indicating a precharge operation. The NAND circuits 101 and 102 together form a latch, which receives the signal ACTV, the signal PRE, and a power-on-reset signal as latch inputs.

This latch is reset when the power-on-reset signal is changed to LOW, and thereby the NAND circuits 101 and 102 output a LOW signal and a HIGH signal, respectively. When the signal ACTV is supplied from the command decoder 100 to the latch as a LOW pulse, the latch changes a state thereof. After the state change, the outputs of the NAND circuits 101 and 102 are HIGH and LOW, respectively. Responding to a rising edge of the output of the NAND circuit 101, the NAND circuit 105 outputs a LOW pulse as a RAS-control signal. Then, when the signal PRE from the command decoder 100 is supplied to the latch as a LOW pulse, the state of the latch is reversed again, so that the outputs of the NAND circuits 101 and 102 become LOW and HIGH, respectively. Responding to a rising edge of the output of the NAND circuit 102, the NAND circuit 106 outputs a LOW pulse as a precharge-control signal.

The RAS-control signal and the precharge-control signal are supplied to the load circuit 13 of FIG. 1 and FIG. 4. Details of the load circuit 13 will be described later. Further, the RAS-control signal and the precharge-control signal are supplied to the NAND circuit 107, which outputs a detection-start signal in response. The detection-start signal becomes HIGH (active) at a timing of either the LOW pulse of the RAS-control signal or the LOW pulse of the precharge-control signal. Namely, the detection-start signal indicates a start of the voltage-detection operation either when the semiconductor memory device is put in an active state for row-access operations or when the semiconductor memory device starts precharge operations.

Figure 12:
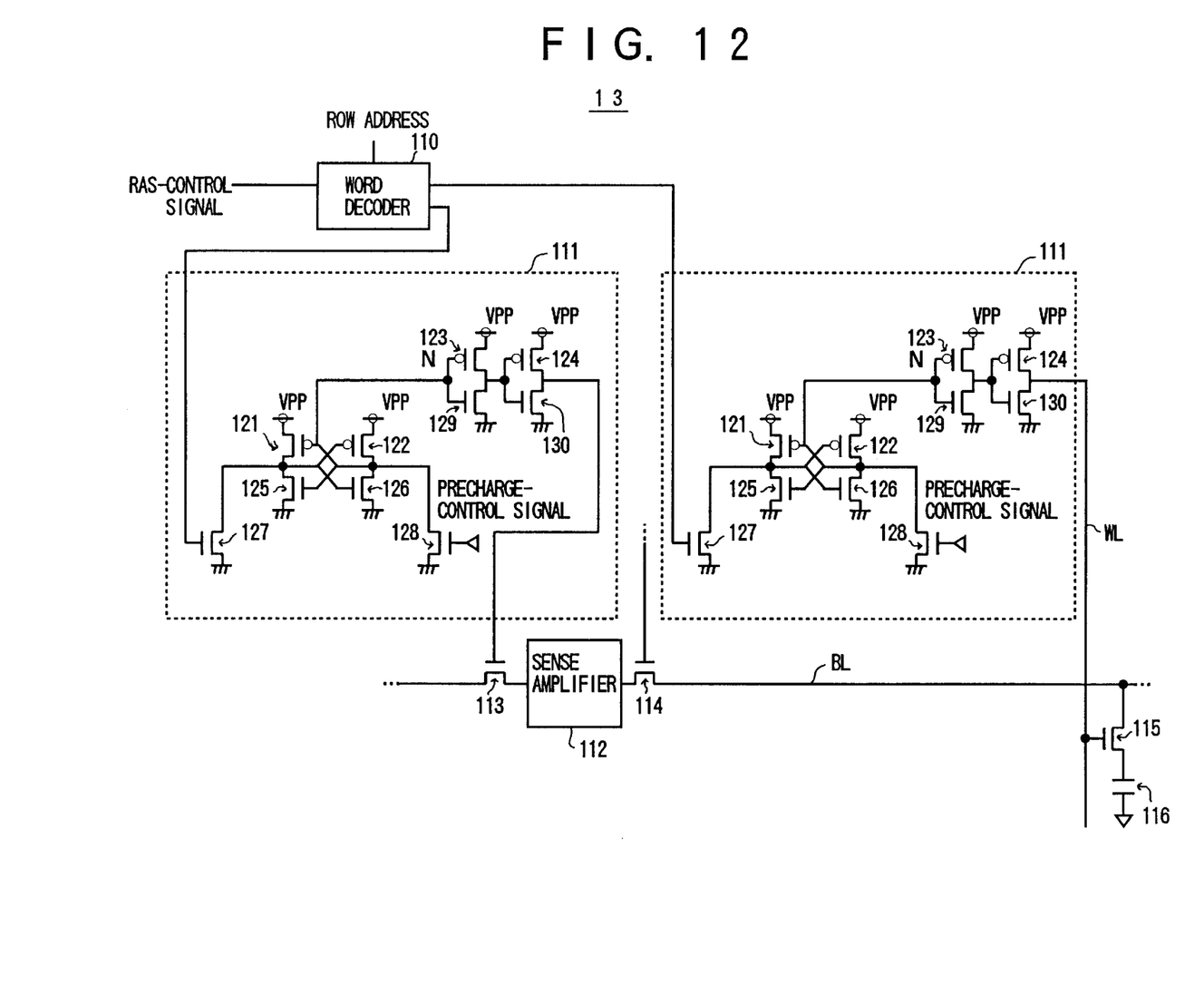
FIG. 12 is a circuit diagram showing a circuit structure of a load circuit.

FIG. 12 is a circuit diagram showing a circuit structure of the load circuit 13.

The load circuit 13 of FIG. 12 includes a word decoder 110, a plurality of voltage-level-conversion circuits 111, a sense amplifier 112, NMOS transistors 113 through 115, and a memory cell 116. Upon receiving a LOW pulse of the RAS-control signal from the trigger circuit 12 of FIG. 11, the word decoder 110 decodes a row address to activate a word line WL at the indicated row address via one of the voltage-level-conversion circuits 111. In FIG. 12, only one word line WL is shown.

The selectively activated word line WL turns on the NMOS transistor 115, so that data of the memory cell 116 is read to a bit-line BL.

At the same time, the word decoder 110 turns on the NMOS transistors 113 and 114 via some of the voltage-level-conversion circuits 111. This results in the data on the bit-line BL being amplified by the sense amplifier 112.

The voltage-level-conversion circuits 111 includes PMOS transistors 121 through 124 and NMOS transistors 125 through 130. One of the voltage-level-conversion circuits 111 which activates the word line WL is taken as an example to describe the operations thereof. When a signal from the word decoder 110 is changed to HIGH, the NMOS transistor 127 is turned on, thereby also turning the PMOS transistor 122 on. A voltage level at a node N is thus HIGH, applying a pumped voltage VPP to the word line WL. By the same token, when the NMOS transistors 113 and 114 need to be turned on, the voltage-level-conversion circuits 111 supply the pumped voltage VPP to the gates of the NMOS transistors 113 and 114.

In this manner, the pumped (boosted) voltage VPP is consumed when the semiconductor memory device is in the active state for the row-access operations.

At a time of the precharge operation, the precharge-control signals supplied to the voltage-level-conversion circuits 111 become active, thereby turning the NMOS transistors 113 through 115 off. During the precharge operation, therefore, the voltage-level-conversion circuits 111 also consume the pumped voltage VPP.

In this manner, a DRAM consumes the pumped voltage VPP both when the DRAM is in the active state and when the DRAM performs the precharge operations. Accordingly, the trigger circuit 12 of FIG. 11 is designed such that it indicates a start of the voltage-detection operation at a timing of either when the DRAM is put in the active state or when the DRAM starts the precharge operation.

Figure 13:
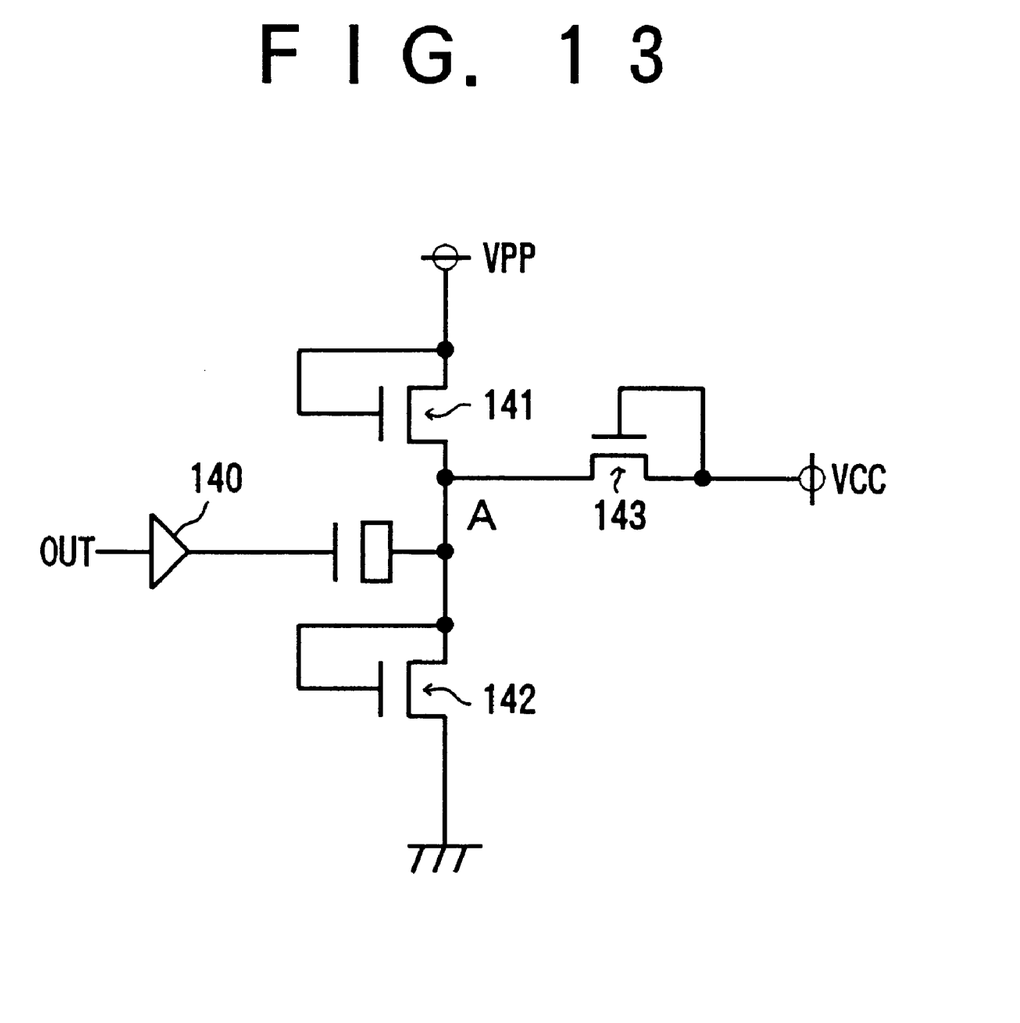
FIG. 13 is a circuit diagram showing a circuit structure of an internal-voltage-generation circuit when a voltage pumping circuit is used as the internal-voltage-generation circuit.

FIG. 13 is a circuit diagram showing a circuit structure of the internal-voltage-generation circuit 14 when a voltage pumping circuit is used as the internal-voltage-generation circuit 14.

The voltage pumping circuit of FIG. 13 includes a buffer 140 and NMOS transistors 141 through 143. The NMOS transistor 143 is turned on by a power voltage VCC externally provided from outside the semiconductor memory device. When the NMOS transistor 143 serving as a diode allows a current to flow therethrough, a voltage level at a node A becomes a voltage (VCC−Vth) lower than the power voltage VCC by a margin of a threshold voltage Vth of the NMOS transistor 143.

Upon receiving the HIGH-level signal OUT from the voltage-detection circuit 11, the buffer 140 outputs a HIGH signal (having the voltage level VCC). The output of the buffer 140 is connected to the node A via a capacitor C, so that the voltage level at the node A becomes (2 VCC−Vth). This turns on the NMOS transistor 141 to supply accumulated charge from the node A to the other end of the NMOS transistor 141, thereby boosting the pumped voltage VPP. In this manner, the pumped voltage VPP which is higher than the power voltage VCC is generated, and is supplied to the load circuit 13 of FIG. 12

Further, the present invention is not limited to these embodiments, but various variations and modifications may be made without departing from the scope of the present invention.

What is claimed is:

1. A semiconductor device consuming a power of a power-source line having a first voltage, said semiconductor device comprising:
    a voltage-detection circuit which detects a voltage level of said first voltage; and
    a control circuit which temporarily actuates said voltage-detection circuit in response to a timing at which said power starts to be consumed.

2. The semiconductor device as claimed in claim 1, wherein said control circuit actuates said voltage-detection circuit when said control circuit receives a detection-start signal indicating said timing.

3. The semiconductor device as claimed in claim 1, further comprising:
    a load circuit which consumes the power of the power source line; and
    a trigger circuit which triggers a start of an operation of said load circuit, and supplies a detection-start signal to said control circuit,
    wherein said control circuit actuates said voltage-detection circuit when said control circuit receives said detection-start signal.

4. The semiconductor device as claimed in claim 3, further comprising an internal-voltage-generation circuit which generates said first voltage, wherein said internal-voltage-generation circuit adjusts said first voltage to a desired voltage when said voltage-detection circuit detects that said first voltage is different from said desired voltage.

5. The semiconductor device as claimed in claim 1, wherein said voltage-detection circuit comprises:
    a potential-divider circuit which divides said first voltage to generate a second voltage; and
    a comparator circuit which compares said second voltage with a reference voltage.

6. The semiconductor device as claimed in claim 1, wherein said control circuit controls said voltage-detection circuit to stop operating when said voltage-detection circuit detects that said first voltage is different from a desired voltage.

7. The semiconductor device as claimed in claim 2, wherein said control circuit actuates said voltage-detection circuit at an end of a predetermined delay period from a moment at which said control circuit receives said detection-start signal, said voltage-detection circuit being actuated for a predetermined time period.

8. A semiconductor device comprising:
    an internal circuit which operates by using an internal voltage as a power voltage; and
    a voltage-detection circuit which temporarily detects a voltage level of said internal voltage in response to a timing at which said internal circuit starts operating.

9. The semiconductor device as claimed in claim 8, wherein said voltage-detection circuit detects said voltage level of said internal voltage for a limited time period starting from said timing.

10. The semiconductor device as claimed in claim 8, wherein said voltage-detection circuit stops operating when detecting that said internal voltage is different from a desired voltage.

11. A voltage-detection circuit comprising:
    a power line supplying a voltage; and
    a circuit which temporarily detects a voltage level of said voltage in response to a timing at which a power of said power line starts to be consumed.

12. The voltage-detection circuit as claimed in claim 11, wherein said circuit detects said voltage level of said voltage for a limited time period starting from said timing.

13. The semiconductor device as claimed in claim 11, wherein said circuit stops operating when detecting that said predetermined voltage is different from a desired voltage.

14. A semiconductor memory device consuming a power at a pumped voltage line when performing row-access operations and precharge operations, said semiconductor memory device comprising:
    a voltage-detection circuit which detects a voltage level of said pumped voltage line; and
    a control circuit which temporarily actuates said voltage-detection circuit in response to a timing at which either one of said row-access operations and said precharge operations is started.

15. The semiconductor device as claimed in claim 1, wherein said first voltage is one of a) a pumped voltage higher than an externally provided power voltage, and b) a substrate voltage lower than a ground voltage.

16. The semiconductor device as claimed in claim 2, wherein said control circuit receives said detection-start signal in response to beginning of an active condition of said semiconductor device.

17. The semiconductor device as claimed in claim 16, wherein said control circuit further receives said detection-start signal in response to beginning of a precharge operation.

18. The semiconductor device as claimed in claim 2, wherein said predetermined delay time is generated by a delay circuit which receives said detection-start signal.

19. The semiconductor device as claimed in claim 7, wherein said predetermined delay period corresponds to a time delay between start of the operation of said load circuit and starting consuming the power of the power source line.

* * * * *